(12) United States Patent
Moschiano et al.

(10) Patent No.: US 11,437,093 B2
(45) Date of Patent: Sep. 6, 2022

(54) METHODS FOR MITIGATING POWER LOSS EVENTS DURING OPERATION OF MEMORY DEVICES AND MEMORY DEVICES EMPLOYING THE SAME

(71) Applicant: Micron Technology, Inc., Boise, ID (US)

(72) Inventors: Violante Moschiano, Avezzano (IT); Andrea Smaniotto, Albignasego (IT)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/418,016

(22) Filed: May 21, 2019

(65) Prior Publication Data

US 2019/0272872 A1 Sep. 5, 2019

Related U.S. Application Data

(62) Division of application No. 15/456,175, filed on Mar. 10, 2017, now abandoned.

(51) Int. Cl.

| | |
|---|---|
| *G11C 11/56* | (2006.01) |
| *G11C 16/10* | (2006.01) |
| *G11C 16/04* | (2006.01) |
| *G11C 5/14* | (2006.01) |
| *G11C 16/30* | (2006.01) |
| *G06F 1/30* | (2006.01) |

(52) U.S. Cl.
CPC ............ *G11C 11/5628* (2013.01); *G06F 1/30* (2013.01); *G11C 5/143* (2013.01); *G11C 16/0483* (2013.01); *G11C 16/10* (2013.01); *G11C 16/30* (2013.01); *G11C 2211/5641* (2013.01)

(58) Field of Classification Search
None
See application file for complete search history.

(56) References Cited

U.S. PATENT DOCUMENTS

| | | | | |
|---|---|---|---|---|
| 5,844,841 | A * | 12/1998 | Takeuchi ........... | G11C 16/0483 365/168 |
| 9,530,491 | B1 * | 12/2016 | Uttarwar ............ | G11C 11/5628 |
| 9,570,159 | B1 | 2/2017 | Wakchaure et al. | |
| 2006/0136758 | A1 * | 6/2006 | Yoon ...................... | G11C 5/147 713/300 |
| 2010/0306446 | A1 * | 12/2010 | Villa ........................ | G11C 5/14 711/102 |
| 2011/0125975 | A1 * | 5/2011 | Kim .................... | G06F 12/0607 711/157 |
| 2011/0296087 | A1 * | 12/2011 | Kim .................... | G06F 12/0246 711/103 |
| 2012/0113740 | A1 * | 5/2012 | Lee ........................ | G11C 16/08 365/230.06 |

(Continued)

*Primary Examiner* — J. H. Hur
(74) *Attorney, Agent, or Firm* — Perkins Coie LLP

(57) ABSTRACT

Memory devices and methods for operating the same are described. The memory devices may include non-volatile memory having a plurality of memory cells, and a controller. The controller may be configured to begin a first programming operation configured to program a first one of the plurality of memory cells with more than one bit of information, terminate the first programming operation in response to detecting a power loss event, and program, with a second programming operation, second and third ones of the plurality of memory cells with the more than one bit of information.

18 Claims, 10 Drawing Sheets

(56) References Cited

U.S. PATENT DOCUMENTS

| | | | | |
|---|---|---|---|---|
| 2012/0173827 A1* | 7/2012 | Wood | ............... | G11C 11/5621 |
| | | | | 711/E12.001 |
| 2012/0191900 A1* | 7/2012 | Kunimatsu | ........... | G06F 3/0638 |
| | | | | 711/E12.008 |
| 2012/0240012 A1* | 9/2012 | Weathers | ............... | G11C 29/52 |
| | | | | 714/E11.034 |
| 2014/0043896 A1* | 2/2014 | Park | ............... | G11C 16/3431 |
| | | | | 365/185.02 |
| 2015/0363105 A1* | 12/2015 | Nakao | ............... | G11C 11/5642 |
| | | | | 711/103 |
| 2016/0268000 A1 | 9/2016 | Thompson et al. | | |
| 2017/0139626 A1 | 5/2017 | Wakchaure et al. | | |
| 2018/0122480 A1* | 5/2018 | Maeda | ............... | G11C 29/72 |

* cited by examiner

METHODS FOR MITIGATING POWER LOSS EVENTS DURING OPERATION OF MEMORY DEVICES AND MEMORY DEVICES EMPLOYING THE SAME

CROSS-REFERENCE TO RELATED APPLICATIONS

This application is a division of U.S. patent application Ser. No. 15/456,175, filed Mar. 10, 2017, which is incorporated herein by reference in its entirety.

TECHNICAL FIELD

The present disclosure generally relates to semiconductor memory devices, and more particularly relates to methods for mitigating power loss events during operation of memory devices and memory devices employing the same.

BACKGROUND

Memory devices are frequently provided as internal, semiconductor, integrated circuits and/or external removable devices in computers or other electronic devices. There are many different types of memory, including volatile and non-volatile memory. Volatile memory, including random-access memory (RAM), static random access memory (SRAM), dynamic random access memory (DRAM), and synchronous dynamic random access memory (SDRAM), among others, may require a source of applied power to maintain its data. Non-volatile memory, by contrast, can retain its stored data even when not externally powered. Non-volatile memory is available in a wide variety of technologies, including flash memory (e.g., NAND and NOR) phase change memory (PCM), resistive random access memory (RRAM), and magnetic random access memory (MRAM), among others.

Flash memory devices can include an array of memory cells that each store data in a charge storage structure, such as a conductive floating gate or a dielectric charge trap. Flash memory devices frequently use a one-transistor memory cell that allows for high memory densities, high reliability, and low power consumption during use. Memory cells in a flash memory device can be programmed to a target state to represent information. For instance, electric charge can be placed on, or removed from, the charge storage structure (e.g., the charge trap or the floating gate) of a memory cell to program the cell to a particular data state. The amount of charge stored on the charge storage structure of the memory cell can be indicated by a threshold voltage ($V_T$) of the cell.

For example, a single level cell (SLC) can be programmed to a targeted one of two different data states, which can be represented by the binary units 1 or 0. Other flash memory cells can be programmed to a targeted one of more than two data states. For example, a flash memory cell which can be programmed to any one of four states (e.g., represented by the binary values 00, 01, 10, 11) can be used to store two bits of data, and may be referred to as a multilevel cell (MLC). Still other flash memory cells can be programmed to any one of eight data states (e.g., 000, 001, 010, 011, 100, 101, 110, 111), permitting the storage of three bits of data in a single cell. Such cells may be referred to as triple level cells (TLC). Even higher number of data states are possible, such as those found in quad level cells (QLC), which can be programmed to any one of 16 data states (e.g., 0000, 0001, 0010, 0011, 0100, 0101, 0110, 0111, 1000, 1001, 1010, 1011, 1100, 1101, 1110, 1111) to store four bits of data. The use of memory cells capable of storing higher numbers of data states can provide higher density memories without increasing the number of memory cells, since each cell can represent more than one digit (e.g., more than one bit).

Memory cells configured to store multiple bits of information can be programmed in multiple passes. For example, a less significant bit can be programmed to the cell with a first programming operation to modify the charge stored on the charge storage structure to one of two targeted charge storage levels (e.g., threshold voltage or $V_T$ levels). A more significant bit can be subsequently programmed to the cell with a second programming operation to modify the charge stored on the charge storage structure to one of four target charge storage levels. For example, FIG. 1 illustrates the charge stored on the charge storage structures of one or more memory cells at various states of a multi pass programming operation. At time 110, charge 112 is stored on the memory cell, indicating that the cell is in an un-programmed or empty state (e.g., an erased state). A first programming operation is utilized at time 120 to program the cell to one of two possible target states on either side of threshold voltage $V_1$. For example, if the less significant bit is a 1, the cell can be programmed to state 122 by programming operation 121 (which, in the illustrated example, may not require the addition of any charge to the cell's charge storage structure). If the less significant bit is a 0, the cell can be programmed to state 124 above threshold voltage $V_1$ by programming operation 123 (e.g., by the addition of charge to the cell's charge storage structure). A second programming operation can be utilized at time 130, to subsequently program the cell to one of four possible target states, separated by threshold voltages $V_2$, $V_3$ and $V_4$, respectively. If the more significant bit is a 1, the cell can be programmed to either of state 132 or 138 (depending upon the value of the less significant bit) by one of programming operation 131 or 137, respectively. If the more significant bit is a 0, the cell can be programmed to either of state 134 or 136 (depending upon the value of the less significant bit) by one of programming operation 133 or 135, respectively. A third programming operation can be utilized at time 140, to subsequently program the cell to one of eight possible target states, separated by threshold voltages $V_5$ through $V_{11}$. Depending upon both the most significant bit to be programmed and the intermediate state at time 130, one of programming operations 141 through 148 may be used to modify the charge on the cell until the desired target state is reached (e.g., one of the eight data states corresponding to the logical values of 111, 011, 001, 101, 100, 000, 010, or 110). Although FIG. 1 uses histograms to illustrate the distribution of stored charges on multiple memory cells programmed to the same threshold voltages at the same time, similar programming operations may be applied to a single memory cell.

Flash programming operations can use a series of programming pulses to increase the charge stored on the charge storage structure of one or more memory cells by a known increment, with each programming pulse being followed by a verification step to determine the cumulative amount of charge stored on the charge storage structures of the one or more memory cells. The programming operation normally continues until a verification step indicates that the targeted charge storage level has been reached. For example, FIG. 2 illustrates the charge stored on the charge storage structure of one or more memory cells at a various states of one such incremental programming operation. The charge 212 stored at time 210 is below a desired target state $V_{target}$ when the incremental programming operation begins. To program the one or more memory cells to the desired target state, a series of programming steps 221, 231 and 241 can be used at each of time 220, 230 and 240 to increase the charge stored on the charge storage structures of the one or more memory cells to charges 222, 232 and 242, respectively. After each programming pulse, the stored charge can be verified to determine whether it has reached the desired target state $V_{target}$. At time 240, as the charge 241 has been increased to the desired target state, the programming operation is completed.

For programming more significant bits to a cell that already has been programmed with less significant bits, the number of programming pulses (and verification steps) used in a programming operation may be larger (e.g., due to the addition of a smaller increment of charge with each programming pulse), such that programming more significant bits to a cell can take more time and/or energy than programming less significant bits. Memory devices can be provided with energy storage structures, such as capacitors, to provide a sufficient amount of power for a sufficient amount of time to complete in-process programming operations that might otherwise be interrupted by a loss of externally applied power. As memory devices are designed with cells that store ever more bits of information, which may take more time and power to program, the size and cost of these energy storage structures may be significantly increased.

DETAILED DESCRIPTION

In the following description, numerous specific details are discussed to provide a thorough and enabling description for embodiments of the present technology. One skilled in the relevant art, however, will recognize that the disclosure can be practiced without one or more of the specific details. In other instances, well-known structures or operations often associated with memory devices are not shown, or are not described in detail, to avoid obscuring other aspects of the technology. For example, several functional components of memory devices and/or memory systems that are well-known to those of skill in the art are not discussed in detail below (e.g., circuit components such as multiplexers and decoders, data structures such as address registers and data registers, etc.). In general, it should be understood that various other devices, systems, and methods in addition to those specific embodiments disclosed herein may be within the scope of the present technology.

As discussed above, with memory devices being designed to store ever more bits of information per cell, and taking ever more energy and time to program, the size and cost of the energy storage structures used to ensure successful completion of programming operations in the event of a loss of external power continue to increase. Accordingly, several embodiments of memory devices in accordance with the present technology can utilize a power loss algorithm (PLA) that can reduce the amount of energy required to complete an interrupted operation, thereby reducing the design requirements for energy storage on the memory device.

Several embodiments of the present technology are directed to memory devices, systems including memory devices, and methods of operating memory devices. In one embodiment, a memory device comprises a non-volatile memory and a controller. The non-volatile memory includes a plurality of memory cells and the controller is configured to compensate for a loss of power. For example, the controller can be configured to (a) begin a first programming operation configured to program a first one of the plurality of memory cells with more than one bit of information, (b) terminate the first programming operation in response to detecting a power loss event, and (c) program, with a second programming operation, second and third ones of the plurality of memory cells with the more than one bit of information.

Figure 1:
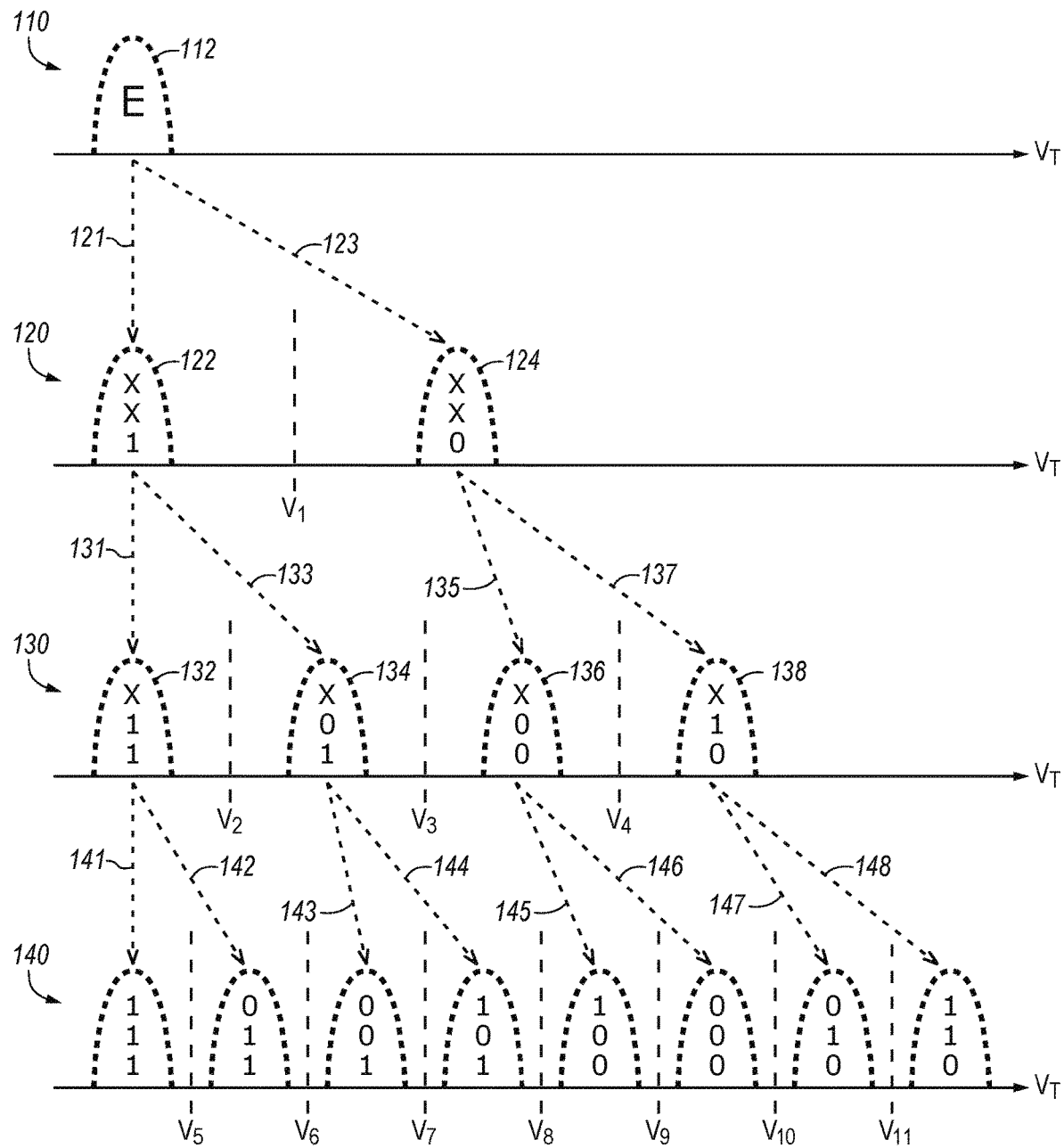
FIG. 1 illustrates the charge stored on the charge storage structure of a memory cell at various states of a multi-pass programming operation.
Figure 2:
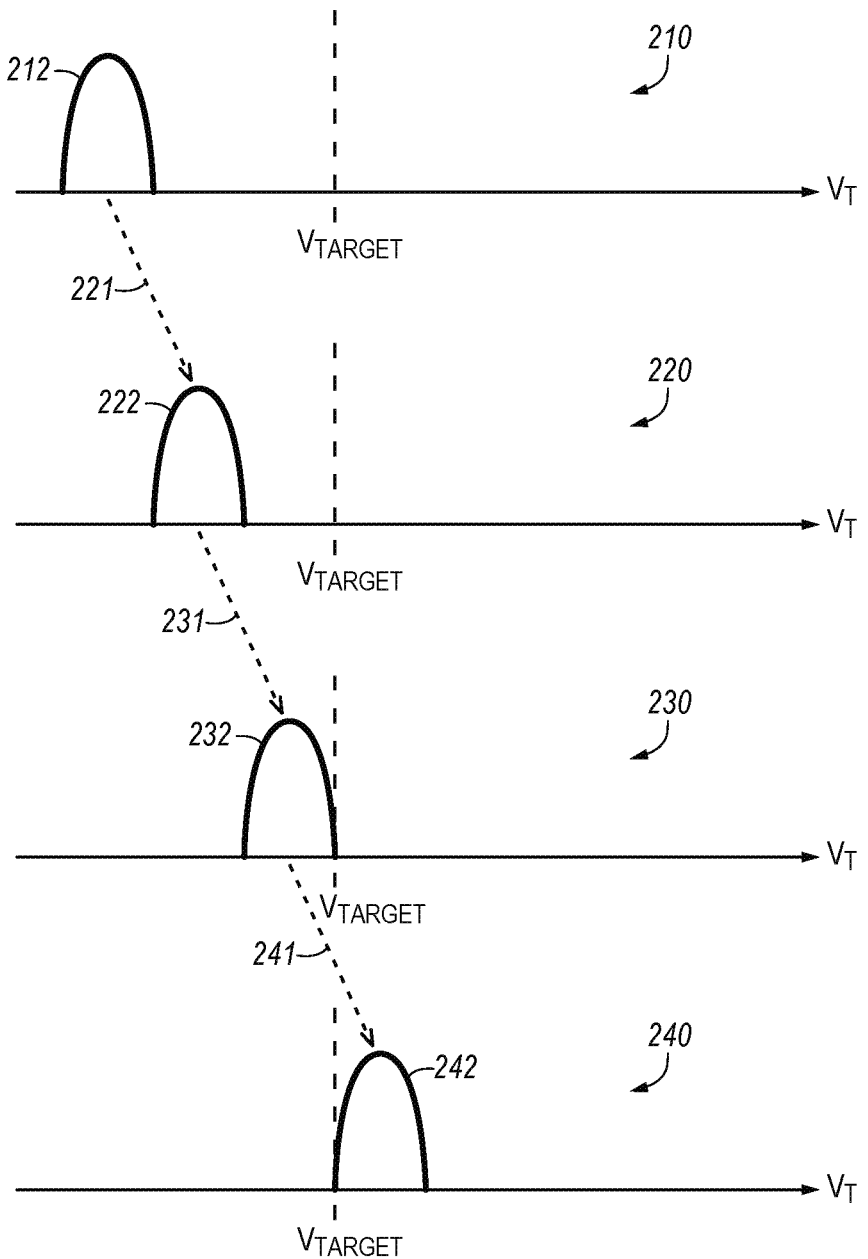
FIG. 2 illustrates the charge stored on the charge storage structure of a memory cell at a various states of an incremental programming operation.
Figure 3:
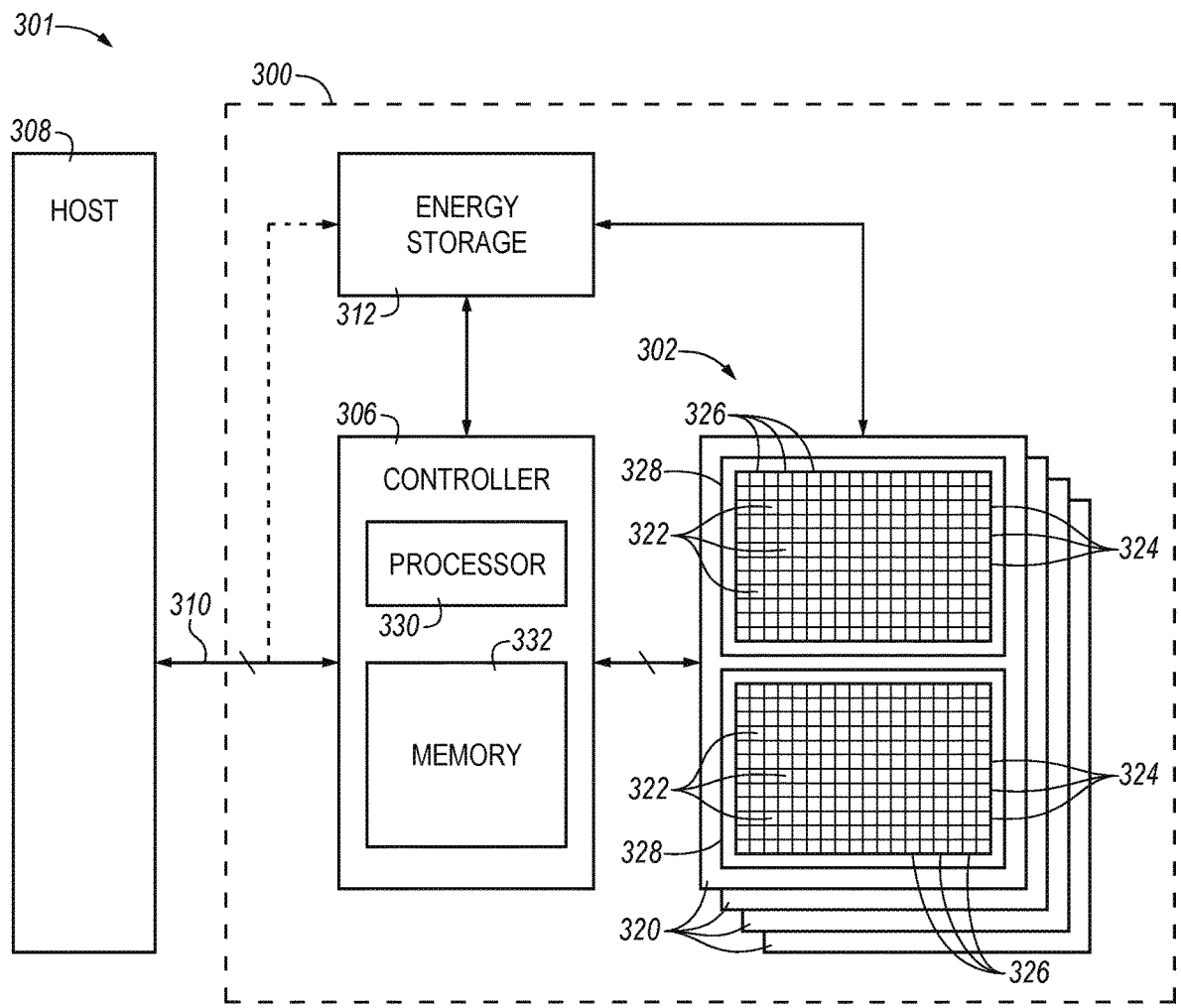
FIG. 3 is a block diagram of a system having a memory device configured in accordance with an embodiment of the present technology.

FIG. 3 is a block diagram of a system 301 having a memory device 300 configured in accordance with an embodiment of the present technology. As shown, the memory device 300 includes a main memory 302 (e.g., NAND flash, NOR flash, chalcogenide PCM, etc.) and a controller 306 operably coupling the main memory 302 to a host device 308 (e.g., an upstream central processor (CPU)). The main memory 302 includes a plurality of memory regions, or memory units 320, which each include a plurality of memory cells 322. Memory units 320 can be individual memory dies, memory planes in a single memory die, a stack of memory dies vertically connected with through-silicon vias (TSVs), or the like. For example, in one embodiment, each of the memory units 320 can be formed from a semiconductor die and arranged with other memory unit dies in a single device package (not shown). In other embodiments, multiple memory units 320 can be co-located on a single die and/or distributed across multiple device packages. The memory cells 322 can include, for example, floating gate, charge trap, phase change, ferroelectric, magnetoresistive, and/or other suitable storage elements configured to store data persistently or semi-persistently. The main memory 302 and/or the individual memory units 320 can also include other circuit components (not shown), such as multiplexers, decoders, buffers, read/write drivers, address registers, data out/data in registers, etc., for accessing and/or programming (e.g., writing) the memory cells 322 and other functionality, such as for processing information and/or communicating with the controller 306.

Memory cells 322 can be arranged in rows 324 (e.g., each corresponding to a word line) and columns 326 (e.g., each corresponding to a bit line). Each word line can include one or more memory pages, depending upon the number of data states the memory cells 322 of that word line are configured to store. For example, a single word line of memory cells 322 that are each configured to store one of two data states (e.g., SLC memory cells configured to store one bit each) can include a single memory page. Alternatively, a single word line of memory cells 322 that are each configured to store one of four data states (e.g., MLC memory cells configured to store two bits each) can include two memory pages. Moreover, memory pages can be interleaved so that a word line comprised of memory cells 322 that are each configured to store one of two data states (e.g., SLC memory cells) can span two memory pages, in an "even-odd bit line architecture," where all the memory cells 322 in odd-numbered columns 326 of a single word line are grouped as a first memory page, and all the memory cells 322 in even-numbered columns 326 of the same word line are grouped as a second memory page. When even-odd bit line architecture is utilized in a word line of memory cells 322 that are each configured to store larger numbers of data states (e.g., memory cells configured as MLC, TLC, QLC, etc.), the number of memory pages per word line can be even higher (e.g., 4, 6, 8, etc.).

Each column 326 can include a string of series-coupled memory cells 322 connected to a common source. The memory cells 322 of each string can be connected in series between a source select transistor (e.g., a field-effect transistor) and a drain select transistor (e.g., a field-effect transistor). Source select transistors can be commonly coupled to a source select line, and drain select transistors can be commonly coupled to a drain select line.

In other embodiments, the memory cells 322 can be arranged in different types of hierarchies and/or groups than shown in the illustrated embodiments. Further, although shown in the illustrated embodiments with a certain number of memory cells, rows, columns, blocks, and memory units for purposes of illustration, the number of memory cells, rows, columns, blocks, and memory units can vary, and can, in other embodiments, be larger or smaller in scale than shown in the illustrated examples. For example, in some embodiments, the memory device 300 can include only one memory unit 320. Alternatively, memory device 300 can include two, three, four, eight, ten, or more (e.g., 16, 32, 64, or more) memory units 320. Although the memory units 320 are shown in FIG. 3 as including two memory blocks 328 each, in other embodiments, each memory unit 320 can include one, three, four eight, or more (e.g., 16, 32, 64, 100, 128, 256 or more memory blocks). In some embodiments, each memory block 328 can include, e.g., $2^{15}$ memory pages, and each memory page within a block can include, e.g., $2^{12}$ memory cells 322 (e.g., a "4 k" page).

The controller 306 can be a microcontroller, special purpose logic circuitry (e.g., a field programmable gate array (FPGA), an application specific integrated circuit (ASIC), etc.), or other suitable processor. The controller 306 can include a processor 330 configured to execute instructions stored in memory. In the illustrated example, the memory of the controller 306 includes an embedded memory 332 configured to perform various processes, logic flows, and routines for controlling operation of the memory device 300, including managing the main memory 302 and handling communications between the memory device 300 and the host device 308. In some embodiments, the embedded memory 332 can include memory registers storing, e.g., memory pointers, fetched data, etc. The embedded memory 332 can include volatile and/or non-volatile memory (e.g., DRAM, SRAM, NAND, NOR, PCM) for storing the memory registers, and can also include read-only memory (ROM) (e.g., for storing micro-code). Although in the example set forth in FIG. 3, memory device 300 has been illustrated as including a controller 306, in another embodiment of the present technology, a memory device may not include a controller, and may instead rely upon external control (e.g., provided by an external host, or by a processor or controller separate from the memory device).

In operation, the controller 306 can directly write or otherwise program (e.g., erase) the various memory regions of the main memory 302, such as by writing to groups of memory pages and/or memory blocks 328. In NAND-based memory, a write operation often includes programming the memory cells 322 in selected memory pages with specific data values (e.g., a string of data bits having a value of either logic 0 or logic 1). An erase operation is similar to a write operation, except that the erase operation re-programs an entire memory block 328 or multiple memory blocks 328 to the same data state (e.g., logic 1).

The controller 306 communicates with the host device 308 over a host-device interface 310. In some embodiments, the host device 308 and the controller 306 can communicate over a serial interface, such as a serial attached SCSI (SAS), a serial AT attachment (SATA) interface, a peripheral component interconnect express (PCIe), or other suitable interface (e.g., a parallel interface). The host device 308 can send various requests (in the form of, e.g., a packet or stream of packets) to the controller 306. A request can include a command to write, erase, return information, and/or to perform a particular operation (e.g., a TRIM operation). A request can also include an interrupt or another command that indicates a change in condition (e.g., a power loss event), which can trigger the implementation of a power loss algorithm.

Host device 308 can be any one of a number of electronic devices capable of utilizing memory for the temporary or persistent storage of information, or a component thereof. For example, host device may be a computing device such as a desktop or portable computer, a server, a hand-held device (e.g., a mobile phone, a tablet, a digital reader, a digital media player), or some component thereof (e.g., a central processing unit, a co-processor, a dedicated memory controller, etc.). Host device 308 may be a networking device (e.g., a switch, a router, etc.) or a recorder of digital images, audio and/or video, a vehicle, an appliance, a toy, or any one of a number of other products. In one embodiment, host device 308 may be connected directly to memory device 300, although in other embodiments, host device 308 may be indirectly connected to memory device (e.g., over a networked connection or through intermediary devices).

The memory device 300 can also include one or more energy storage components, such as energy storage component 312, in accordance with one embodiment. Energy storage component 312 can include one or more capacitors, supercapacitors, batteries, and/or other energy storage devices.

Memory device 300 expends energy in performing various operations, including reading, writing and erasing memory cells 322 in main memory 302. In normal operation, energy may be provided over host-device interface 310 (e.g., via a single interface supplying both power and communications, or via a dedicated power connection). In the event of an interruption of externally provided power during an operation, energy storage component 312 can provide a sufficient amount of power for a sufficient duration to complete the interrupted operation (e.g., by providing power to both controller 306 and main memory 302 to complete an operation interrupted by the power loss event).

The energy storage capacity and power delivery capability of energy storage component 312 may be configured, in accordance with one embodiment, to provide sufficient power for sufficient duration to complete an energy-intensive operation, such as writing a most significant bit to one or more memory cells and/or pages that are configured to store a high bit density (e.g., an XP programming operation to a TLC-format cell). As memory devices are designed with cells that store ever more bits of information, which may take more time and power to program, the size and cost of the energy storage structures used to ensure successful completion of programming operations for more significant bits in the event of a loss of external power may be significantly increased. Accordingly, memory devices in accordance with various embodiments of the present technology can utilize a power loss algorithm (PLA) which can reduce the amount of energy required to complete an interrupted operation, thereby reducing the design requirements for energy storage on the memory device.

An example of one such power loss algorithm in accordance with the present technology is described in greater detail with reference to FIG. 4, which illustrates the charge stored on the charge storage structures of memory cells at various states of a programming operation. As will be readily understood by one of skill in the art, the illustrated mapping of logic states to charge levels is but one example, and the different charge states of a memory cell may correspond to different logic states than those shown in FIG. 4. At time 410, a first memory cell 401 (or, e.g., a group of memory cells in the same page and configured to be programmed at about the same time to the same target data state) is shown to have a level of charge 412 corresponding to an erased state. At time 420, a lower page (LP) programming operation 421 is performed on the first memory cell 401, such that a logic 0 for the lower page at the first memory cell is stored by increasing the charge on the charge storage structure of the first memory cell above the threshold voltage $V_1$ to state 422. In one embodiment, the LP programming operation can be an incremental programming operation that utilizes a plurality of programming pulses and verification steps to increment the charge on the charge storage structure of the first memory cell by a small amount until the desired level of charge has been stored. Alternatively, in another embodiment, the LP programming operation can utilize a single large pulse of high voltage to program the first memory cell to the desired state. In accordance with various embodiments of the present technology, the first pass (e.g., the LP programming operation) of a three-pass programming operation for a TLC-format memory cell can take from 200 to 600 µs.

At time 430, an upper page (UP) programming operation 431 is performed, such that a logic 0 for the upper page at the first memory cell 401 is stored by increasing the charge on the charge storage structure of the first memory cell above the threshold voltage $V_3$ to state 432. In one embodiment, the UP programming operation can be an incremental programming operation that utilizes a plurality of programming pulses and verification steps to increment the charge on the charge storage structure of the first memory cell by a small amount until the desired level of charge has been stored. Alternatively, in another embodiment, the UP programming operation can utilize a single large pulse of high voltage to program the first memory cell to the desired state. In accordance with various embodiments of the present technology, the second pass (e.g., the UP programming operation) of a three-pass programming operation for a TLC-format memory cell can take from 500 to 1500 µs.

At time 440, an extra page (XP) programming operation 441 is begun, whereby charge is added to the charge storage structure of the first memory cell 401 in order to increase the charge above the threshold voltage $V_8$ (e.g., to store a logic 1 for the extra page at the first memory cell). In one embodiment, the XP programming operation can be an incremental programming operation that utilizes a plurality of programming pulses and verification steps to increment the charge on the charge storage structure of the first memory cell by a small amount until the desired level of charge has been stored. Alternatively, in another embodiment, the XP programming operation can utilize a single large pulse of high voltage to program the first memory cell to the desired state. In accordance with various embodiments of the present technology, the third pass (e.g., the XP programming operation) of a three-pass programming operation for a TLC-format memory cell can take from 1200 to 4500 µs. However, before the XP programming operation 441 of the present illustrative embodiment can be completed, a power loss event occurs, while memory cell 401 has a state 442 below the target threshold voltage $V_8$.

In accordance with one embodiment, the memory device may detect a power loss event based upon a signal from a connected host. For example, the host may assert a command (e.g., a write protect signal, or a special-purpose power loss algorithm command, or some other indicia of power loss) during a programming operation to indicate that the programming operation should be aborted due to a power loss event. In another embodiment, the memory device may detect a power loss event based upon a reduction in applied power (e.g., a reduction in voltage on the power line of the host-device interface).

In accordance with another embodiment of the present technology, the power loss algorithm may be triggered by events other than the loss of applied power. For example, an algorithm that terminates a high-energy programming operation that prioritizes data density over speed and/or energy consumption in favor of a different programming operation prioritizing speed and/or energy consumption over data density may be triggered by any one of a number of different events, including an impending power loss (e.g., an indicia of imminent system shut-down), a reduction in available energy (e.g., a low battery warning), a change in user preference from storage utilization prioritization to energy or speed prioritization, etc. Accordingly, as used herein, the term "power loss event" is defined to mean an event which indicates a present loss of power, an imminent loss of power, a present reduction in available power, an imminent reduction in available power, a present reduction in available energy, an imminent reduction in available energy, a change in priority from storage utilization to energy efficiency, or a change in priority from storage utilization to programming speed.

In response to detecting the power loss event, in accordance with an embodiment of the present technology, the memory device terminates the XP programming operation 441 (e.g., by interrupting the programming pulse and verification cycle) and begins a power loss algorithm (PLA) programming operation at time 450. The PLA programming operation writes LP and UP data from the first memory cell 401 (e.g., the logic 0 and logic 0 programmed at times 420 and 430, respectively) to second and third memory cells 402 and 403, using an SLC format, in programming operations 451 and 453, respectively (e.g., by increasing the charge stored on the charge storage structures of each of memory cells 402 and 403 above a threshold voltage $V_{SLC}$, to states 452 and 454, respectively). Programming operations 451 and 453 can be performed consecutively, in accordance with one embodiment (e.g., where second and third memory cells 402 and 403 are on a same memory page). In accordance with another embodiment, programming operations 451 and 453 can be performed concurrently (e.g., where second and third memory cells 402 and 403 are located on separate memory pages, and/or configured in a manner to permit concurrent or simultaneous write operations).

In accordance with one embodiment, the memory device may write LP and UP data from the cells and/or pages to which an interrupted programming operation was writing data without first having to read the cells and/or pages. For example, the memory device can write the LP and UP data from an input/output buffer storing the data (e.g., a buffer storing the data for all the cells and/or pages to which the interrupted programming operation was writing data) without first having to read the data back from the cells and/or pages. Alternatively, the memory device can read the LP and UP data out of the memory cells and/or pages to which the interrupted first programming operation was writing before subsequently writing the LP and UP data to the second and third memory cells.

In one embodiment, the PLA programming operation can be an incremental programming operation that utilizes a plurality of programming pulses and verification steps to increment the charge on the charge storage structure of the second and third memory cells by a small amount until the desired level of charge has been stored. Alternatively, in another embodiment, the PLA programming operation can utilize a single large pulse of high voltage to program each of the second and third memory cells to the desired state. In accordance with various embodiments of the present technology, a single pass programming operation for an SLC-format memory cell can take from 150 to 300 μs. Accordingly, a memory system using a PLA programming operation that stores LP and UP data from an interrupted XP programming operation may require from 50% to 90% less energy storage to complete the PLA programming operation than would be required to complete the XP programming operation (e.g., where the PLA programming operation is between two and ten times faster than the XP programming operation), in accordance with one embodiment of the present technology.

According to one embodiment of the present technology, the memory device can dedicate a portion of memory (e.g., main memory 302 illustrated in FIG. 3) for use by the PLA programming operation. For example, a memory device implementing a PLA according to an embodiment of the present technology can maintain a list or table (e.g., in embedded memory 332) of one or more predetermined cells, pages, and/or blocks of memory cells for PLA programming (e.g., in SLC mode or any other suitable low-density mode), such that upon detection of a power loss event, a sufficient quantity of memory cells that are ready for programming are available to store the data (e.g., the LP and UP data) from the cells and/or pages to which an interrupted programming operation was writing data. Moreover, in a subsequent power loss recovery operation, the memory device can determine upon powering-up that a power loss event has occurred (e.g., by maintaining a flag or other indicia of the power loss event having occurred, or by detecting an uncorrectable ECC error when reading the block to which the interrupted programming operation was writing) and, based on that determination, read the contents of the predetermined memory cells, pages and/or blocks to recover the data programmed by the PLA programming operation.

According to one embodiment, the one or more predetermined cells and/or pages can be part of the same memory block as the cells and/or pages to which an interrupted programming operation was writing data. In another embodiment, the one or more predetermined cells and/or pages can be located on a different memory block from the cells and/or pages to which an interrupted programming operation was writing data. In embodiments in which more than one predetermined page is reserved by the memory device for use by a PLA programming operation, the predetermined pages may all be on a single block, or alternatively distributed over multiple memory blocks. In embodiments in which more than one predetermined pages are distributed over multiple memory blocks, the memory blocks may all be on a single memory unit, or alternatively distributed over multiple memory units.

In still another embodiment of the present technology, in a system in which a memory device is operably connected to a host, the host may dynamically select a location (e.g., memory cells and/or pages in a main memory thereof) in the memory device for a PLA programming operation to program data (e.g., in an SLC format) from the cells and/or pages to which an interrupted programming operation was writing data. Alternatively, the host can predetermine (e.g., at boot-up, or upon connecting the memory device to the host, etc.) a location in the memory device for a PLA programming operation to program data (e.g., in an SLC format) from the cells and/or pages to which an interrupted programming operation was writing data.

In the foregoing illustrative embodiment described with reference to FIG. 4, the XP page data that was to be programmed to the first memory cell 401 at time 440 (e.g., the "in-flight" data) was abandoned by the power loss algorithm programming operation. For many memory system applications, the loss of in-flight data during a power loss event is a recoverable error and therefore an acceptable design criterion for a power loss algorithm. In accordance with some embodiments of the present technology, however, the lower power requirements of a PLA programming operation permit the XP data to be safely written as part of the operation, even in memory devices with reduced energy storage capacity. One such embodiment can be seen with reference to FIG. 5, which illustrates the charge stored on the charge storage structures of memory cells at various states of a programming operation in accordance with another embodiment of the present technology.

Figure 5:
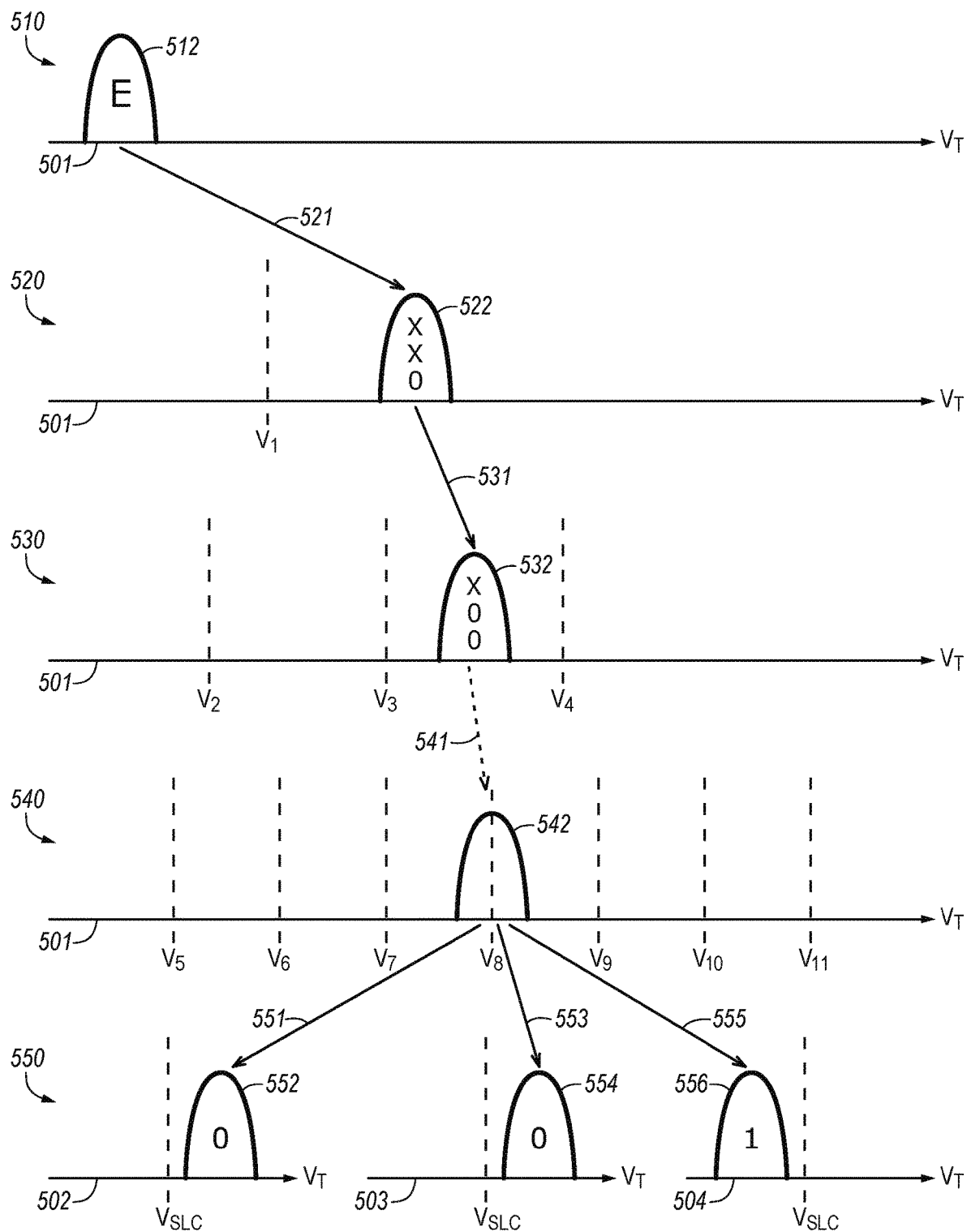
FIG. 5 illustrates the charge stored on the charge storage structures of memory cells at various states of a programming operation in accordance with an embodiment of the present technology.

Turning to FIG. 5, a first memory cell 501 (or, e.g., a group of memory cells in the same page and configured to be programmed at about the same time) is shown at time 510 to have a level of charge 512 corresponding to an erased state. At time 520, a LP programming operation 521 is performed on the first memory cell 501, such that a logic 0 for the lower page at the first memory cell is stored by increasing the charge on the charge storage structure of the first memory cell above the threshold voltage $V_1$ to state 522. In one embodiment, the LP programming operation can be an incremental programming operation that utilizes a plurality of programming pulses and verification steps to increment the charge on the charge storage structure of the first memory cell by a small amount until the desired level of charge has been stored. Alternatively, in another embodiment, the LP programming operation can utilize a single large pulse of high voltage to program the first memory cell to the desired state. In accordance with various embodiments of the present technology, the first pass (e.g., the LP programming operation) of a three-pass programming operation for a TLC-format memory cell can take from 200 to 600 µs.

At time 530, a UP programming operation 531 is performed, such that a logic 0 for the upper page at the first memory cell 501 is stored by increasing the charge on the charge storage structure of the first memory cell above the threshold voltage $V_3$ to state 532. In one embodiment, the UP programming operation can be an incremental programming operation that utilizes a plurality of programming pulses and verification steps to increment the charge on the charge storage structure of the first memory cell by a small amount until the desired level of charge has been stored. Alternatively, in another embodiment, the UP programming operation can utilize a single large pulse of high voltage to program the first memory cell to the desired state. In accordance with various embodiments of the present technology, the second pass (e.g., the UP programming operation) of a three-pass programming operation for a TLC-format memory cell can take from 500 to 1500 µs.

At time 540, an XP programming operation 541 is begun, whereby charge is added to the charge storage structure of the memory cell 501 in order to increase the charge above the threshold voltage $V_8$ (e.g., to store a logic 1 for the extra page at the first memory cell). In one embodiment, the XP programming operation can be an incremental programming operation that utilizes a plurality of programming pulses and verification steps to increment the charge on the charge storage structure of the first memory cell by a small amount until the desired level of charge has been stored. Alternatively, in another embodiment, the XP programming operation can utilize a single large pulse of high voltage to program the first memory cell to the desired state. In accordance with various embodiments of the present technology, the third pass (e.g., the XP programming operation) of a three-pass programming operation for a TLC-format memory cell can take from 1200 to 4500 µs. However, before the XP programming operation of the present illustrative embodiment can be completed, a power loss event occurs, while memory cell 501 has a state 542 below the target threshold voltage $V_8$.

In response to detecting the power loss event, in accordance with an embodiment of the present technology, the memory device terminates the XP programming operation 541 (e.g., by interrupting the programming pulse and verification cycle) and begins a PLA programming operation at time 550. The PLA programming operation writes LP and UP data from the first memory cell 501 (e.g., the logic 0 and logic 0 programmed at times 520 and 530, respectively) to second and third memory cells 502 and 503, using an SLC format, in programming operations 551 and 553, respectively (e.g., by increasing the charge stored on the charge storage structures of each of memory cells 502 and 503 above a threshold voltage $V_{SLC}$, to states 552 and 554, respectively). The PLA programming operation also writes the in-flight XP data (e.g., the logic 1 that was in the process of being programmed to the first memory cell 501 when the power loss event occurred) to fourth memory cell 504 in programming operation 555, also using an SLC format (e.g., by leaving the charge stored on the charge storage structure of memory cell 504 below threshold voltage $V_{SLC}$, in state 556).

In one embodiment, the PLA programming operation can be an incremental programming operation that utilizes a plurality of programming pulses and verification steps to increment the charge on the charge storage structure of the second, third and fourth memory cells by a small amount until the desired level of charge has been stored. Alternatively, in another embodiment, the PLA programming operation can utilize a single large pulse of high voltage to program each of the second, third and fourth memory cell to the desired state. In accordance with various embodiments of the present technology, a single pass programming operation for an SLC-format memory cell can take from 150 to 300 µs. Accordingly, a memory system using a PLA programming operation that stores LP, UP and XP data from an interrupted XP programming operation may require from 50% to 90% less energy storage to complete the PLA programming operation than would be required to complete the XP programming operation (e.g., where the PLA programming operation is between two and ten times faster than the XP programming operation), in accordance with one embodiment of the present technology Although in the foregoing embodiments illustrated in FIGS. 4 and 5, PLA programming operations that program data to SLC-format memory cells are shown, PLA programming operations in other embodiments may program data to memory cells in other formats. For example, in an embodiment in which a memory device performing an energy-intensive XP programming operation is interrupted by a power loss event, the memory device may implement a PLA programming operation which programs data from the cells and/or pages to which the interrupted XP programming operation was writing data to one or more cells in an MLC-format (e.g., using a single-pass or a two-pass MLC programming operation that, although not as fast or energy-efficient as an SLC programming operations, is still is less energy-intensive than the interrupted XP programming operation).

Figure 4:
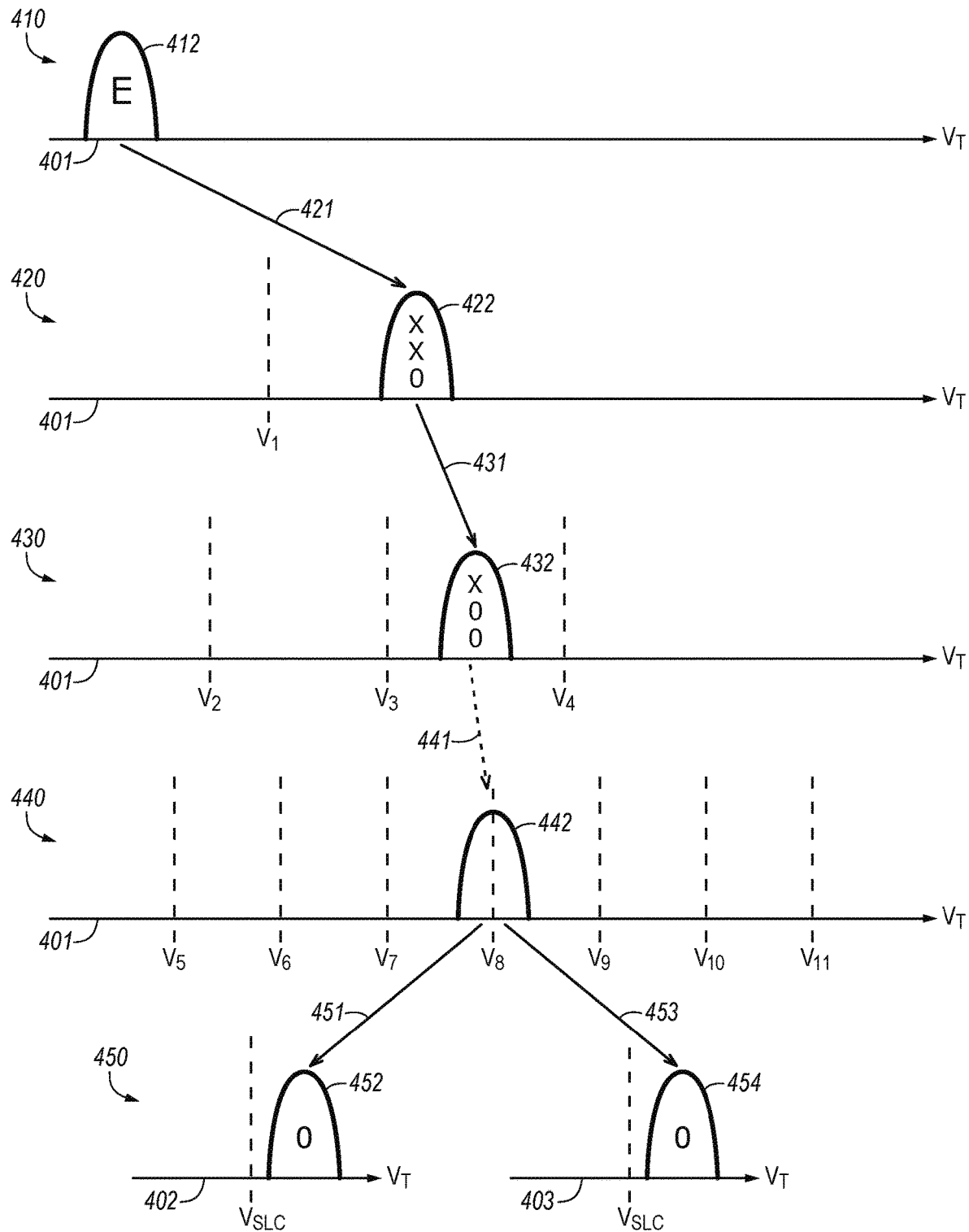
FIG. 4 illustrates the charge stored on the charge storage structures of memory cells at various states of a programming operation in accordance with an embodiment of the present technology.

Moreover, although in the foregoing embodiments illustrated in FIGS. 4 and 5, PLA programming operations were triggered by the detection of a power loss event during programming XP data to one or more TLC-format memory cells, embodiments of the present technology have application to memory cells with higher or lower data density (e.g., MLC-format memory cells, QLC-format memory cells, etc.). For example, one such embodiment can be seen with reference to FIG. 6, which illustrates the charge stored on the charge storage structures of memory cells at various states of a programming operation in accordance with another embodiment of the present technology.

Figure 6:
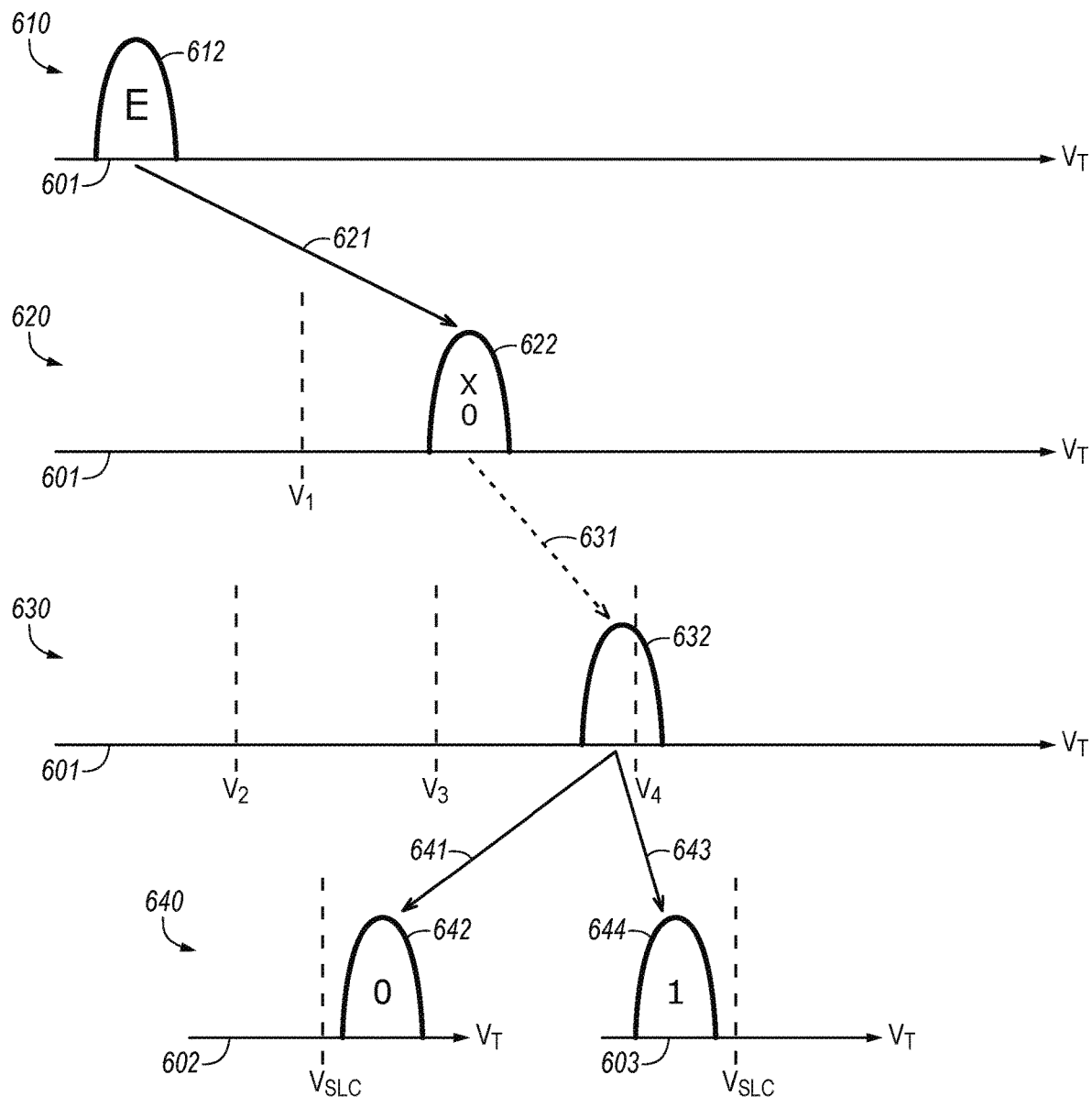
FIG. 6 illustrates the charge stored on the charge storage structures of memory cells at various states of a programming operation in accordance with an embodiment of the present technology.

Turning to FIG. 6, a first memory cell 601 (or, e.g., a group of memory cells on the same word line configured to be programmed at about the same time) is shown at time 610 to have a level of charge corresponding to an erased state 612. At time 620, a LP programming operation 621 is performed on the first memory cell, such that a logic 0 for the lower page at the first memory cell 601 is stored by increasing the charge on the charge storage structure of the first memory cell above the threshold voltage $V_1$ to state 622. In one embodiment, the LP programming operation can be an incremental programming operation that utilizes a plurality of programming pulses and verification steps to increment the charge on the charge storage structure of the first memory cell by a small amount until the desired level of charge has been stored. Alternatively, in another embodiment, the LP programming operation can utilize a single large pulse of high voltage to program the first memory cell to the desired state. In accordance with various embodiments of the present technology, the first pass (e.g., the LP programming operation) of a two-pass programming operation for a MLC-format memory cell can take from 200 to 600 µs.

At time 630, a UP programming operation 631 is begun, whereby charge is added to the charge storage structure of the first memory cell 601 in order to increase the charge above the threshold voltage $V_4$ (e.g., to store a logic 1 for the upper page at the first memory cell) In one embodiment, the UP programming operation can be an incremental programming operation that utilizes a plurality of programming pulses and verification steps to increment the charge on the charge storage structure of the first memory cell by a small amount until the desired level of charge has been stored. Alternatively, in another embodiment, the UP programming operation can utilize a single large pulse of high voltage to program the first memory cell to the desired state. In accordance with various embodiments of the present technology, the second pass (e.g., the UP programming operation) of a two-pass programming operation for a MLC-format memory cell can take from 500 to 1500 µs. However, before the UP programming operation of the present illustrative embodiment can be completed, a power loss event occurs, while memory cell 601 has a state 632 below the target threshold voltage $V_8$.

In response to detecting the power loss event, in accordance with an embodiment of the present technology, the memory device terminates the UP programming operation 631 (e.g., by interrupting the programming pulse and verification cycle) and begins a PLA programming operation at time 640. The PLA programming operation writes LP data from the first memory cell 601 (e.g., the logic 0 programmed at time 620) to second memory cell 602, using an SLC format, in programming operation 641 (e.g., by increasing the charge stored on the charge storage structure of memory cell 602 above a threshold voltage $V_{SLC}$, to states 642). In one embodiment, the PLA programming operation can also write the in-flight UP data (e.g., the logic 1 that was in the process of being programmed to the first memory cell 601 when the power loss event occurred) to third memory cell 603, using an SLC format, in programming operation 643 (e.g., by increasing the charge stored on the charge storage structures of memory cell 503 above a threshold voltage $V_{SLC}$, to 644).

In one embodiment, the PLA programming operation can be an incremental programming operation that utilizes a plurality of programming pulses and verification steps to increment the charge on the charge storage structure of the second and third memory cells by a small amount until the desired level of charge has been stored. Alternatively, in another embodiment, the PLA programming operation can utilize a single large pulse of high voltage to program each of the second and third memory cell to the desired state. In accordance with various embodiments of the present technology, a single pass programming operation for an SLC-format memory cell can take from 150 to 300 µs. Accordingly, a memory system using a PLA programming operation that stores LP and UP data from an interrupted UP programming operation may require from 30% to 50% less energy storage to complete the PLA programming operation than would be required to complete the UP programming operation (e.g., where the PLA programming operation is between two and three times faster than the UP programming operation), in accordance with one embodiment of the present technology In another embodiment, a memory device may use a PLA programming operation to program data from the cells and/or pages to which the interrupted programming operation was writing data, using any suitable programming operation that can store, in at least one other cell, at least some of the data (e.g., an amount of data sufficient to permit data recovery, given the design of the memory system and its tolerance for the loss of in-flight data during a power-loss event), and which requires less energy than the interrupted programming operation. For example, in one embodiment, the PLA programming operation may program the data to different cells using a lower data density per cell (e.g., using a format that is configured to store data in one of fewer possible data states than the format of the cell to which an interrupted programming operation was writing). Alternatively, in another embodiment, the PLA programming operation may program the data to different cells using a programming operation that utilizes less energy (e.g., one with larger and/or fewer programming pulses).

In accordance with one embodiment, by terminating a programming operation in response to a power loss event and programming data from the cells and/or pages to which an interrupted programming operation was writing to one or more different cells, the interrupted programming operation can be resumed after the restoration of external power without erasing the block on which the interrupted programming operation was operating. For example, the location of the cells and/or pages to which the interrupted programming operation was writing data may be determined by evaluating a stored address indicating the location of the last programming operation begun by the memory device before the power loss event occurred. Alternatively, the cell/page location may be determined by reading from the block containing the cells and/or pages until an error is detected (e.g., an uncorrectable ECC error), indicating thereby the location to which the programming operation was programming data when interrupted. Based on the known values for the LP and UP data, and either the known value of XP data (e.g., as determined from a memory location to which the XP data was written) or the reconstructed value of XP data (e.g., in a memory system in which the loss of in-flight data is mitigated by other means), the interrupted programming operation can resume from where it left off, continuing to increase the charge on the cells and/or pages (e.g., with incremental programming pulses and verification steps) until the desired threshold voltage has been reached.

Figure 7:
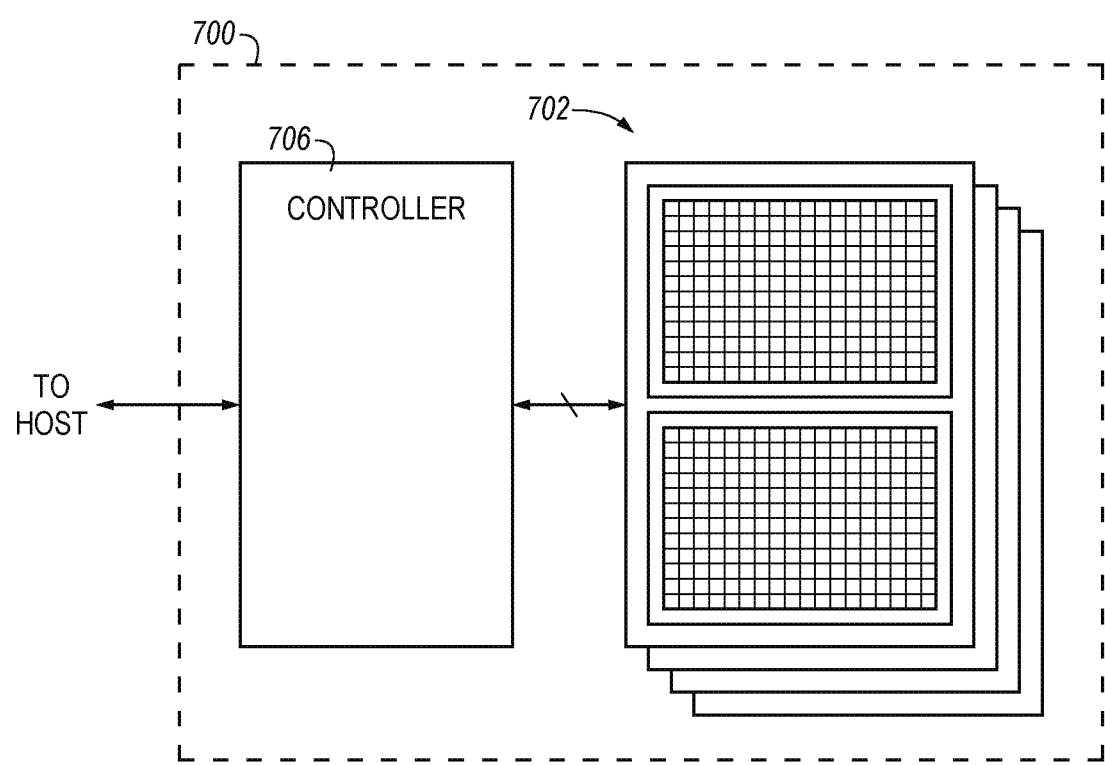
FIG. 7 is a block diagram of a memory device configured in accordance with an embodiment of the present technology.

FIG. 7 is a block diagram of a memory device 700 configured in accordance with an embodiment of the present technology. As shown, the memory device 700 includes a main memory 702 (e.g., NAND flash) and a controller 706 operably connected to the main memory 702, for communicating with a host device (not illustrated). In accordance with an embodiment of the present technology, memory device 700 differs from memory device 300 (illustrated in FIG. 3, above) at least in that memory device 700 does not include an energy storage component. In this regard, memory device 700 may be suited for use with a host device capable of providing power to memory device 700 even after the host device experiences a power loss event (e.g., a host device which includes one or more energy storage components for providing sufficient power to memory device 700 for sufficient time to complete an operation interrupted by a power loss event). By implementing a power loss algorithm similar to those described in greater detail with respect to the embodiments above (e.g., a power loss algorithm in which controller 706 terminates an energy-intensive programming operation in response to the power loss event, and utilizes a less energy-intensive programming operation to program at least some of the data from the cells and/or pages to which the interrupted programming operation was writing data to at least one other cell and/or page), memory device 700 can reduce the design requirements for the energy storage components in a host device to which it is attached.

Although in the foregoing embodiments of the present technology, examples of power loss algorithms have been described with reference to NAND flash memory cells, the present technology has application to other memory types. For example, other charge-storage memory types, such as NOR flash, may also utilize memory cells configured to store different densities of data (e.g., by storing different amounts of charge to represent more than two data states per memory cell). For such other charge-storage memory types, power loss algorithms that respond to changed operating conditions by prioritizing high-speed, low-power programming operations over high-density programming operations may enjoy a number of benefits, in accordance with various embodiments of the present technology. Moreover, in other embodiments of the present technology, similar power loss algorithms may have application to memory devices that do not rely upon stored charge to represent data states. For example, phase change memory (PCM) devices that utilize two or more different material phases and/or combinations thereof in a chalcogenide memory cell may also store more than one bit of information per cell (e.g., by utilizing more than two data states); for these and for other memory devices that can be configured to store more than two data states in a single memory cell (e.g., magnetic memory, ferroelectric memory, etc.), power loss algorithms in accordance with other embodiments of the present technology may also be employed.

Figure 8:
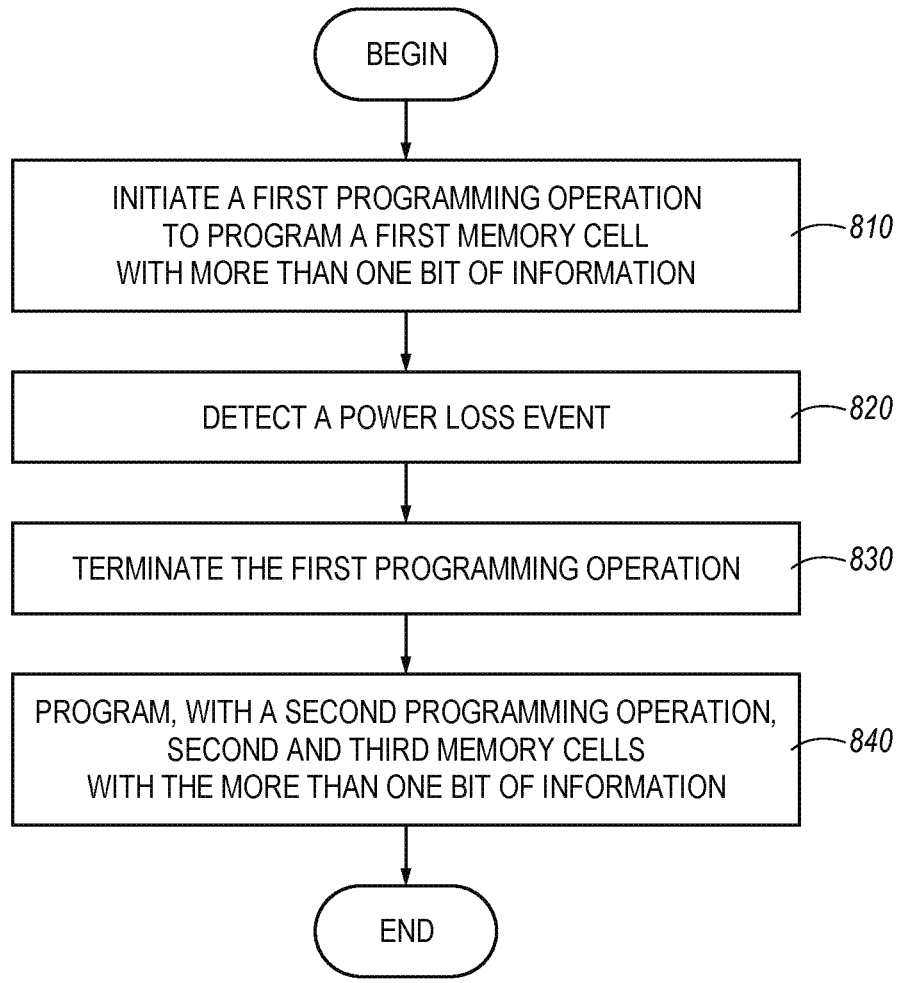
FIG. 8 is a flow chart illustrating a method of operating a memory device in accordance with an embodiment of the present technology.

FIG. 8 is a flow chart illustrating a method of operating a memory device in accordance with an embodiment of the present technology. The method begins in step 810, in which a first programming operation is initiated. The first programming operation is configured to program a first memory cell of a memory device with more than one bit of information. In step 820, the method continues by detecting a power loss event. In step 830, the first programming operation is terminated in response to the detection of a power loss event. In step 840, a second programming operation programs second and third memory cells with the more than one bit of information.

Figure 9:
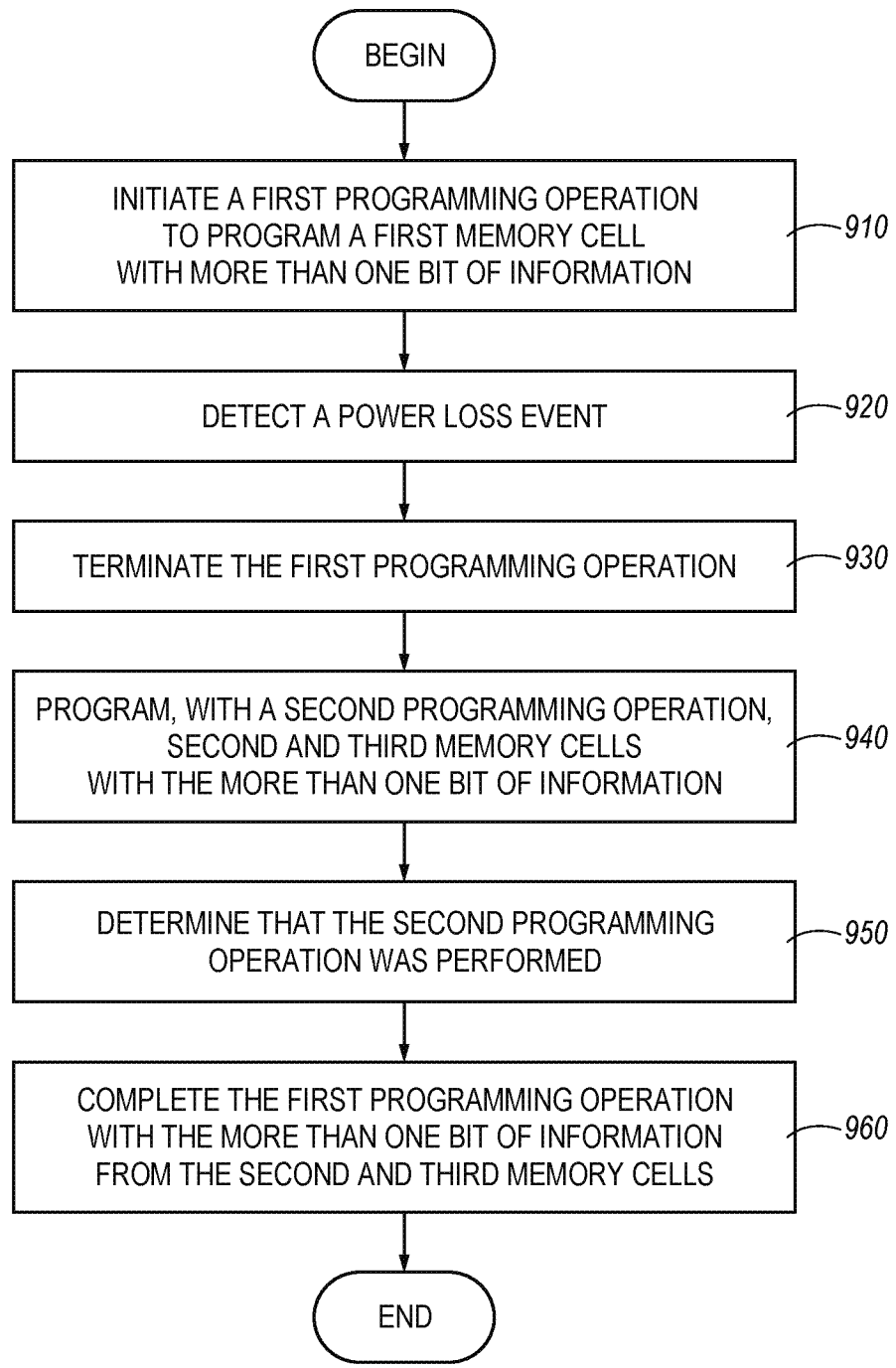
FIG. 9 is a flow chart illustrating a method of operating a memory device in accordance with an embodiment of the present technology.

FIG. 9 is a flow chart illustrating a method of operating a memory device in accordance with an embodiment of the present technology. The method begins in step 910, in which a first programming operation is initiated. The first programming operation is configured to program a first memory cell of a memory device with more than one bit of information. In step 920, the method continues by detecting a power loss event. In step 930, the first programming operation is terminated in response to the detection of a power loss event. In step 940, a second programming operation programs second and third memory cells with the more than one bit of information. In step 950, upon restoration of power to the memory device, the performance of the second programming operation is determined, and in step 960, the first programming operation is completed with the more than one bit of information from the second and third memory cells.

Figure 10:
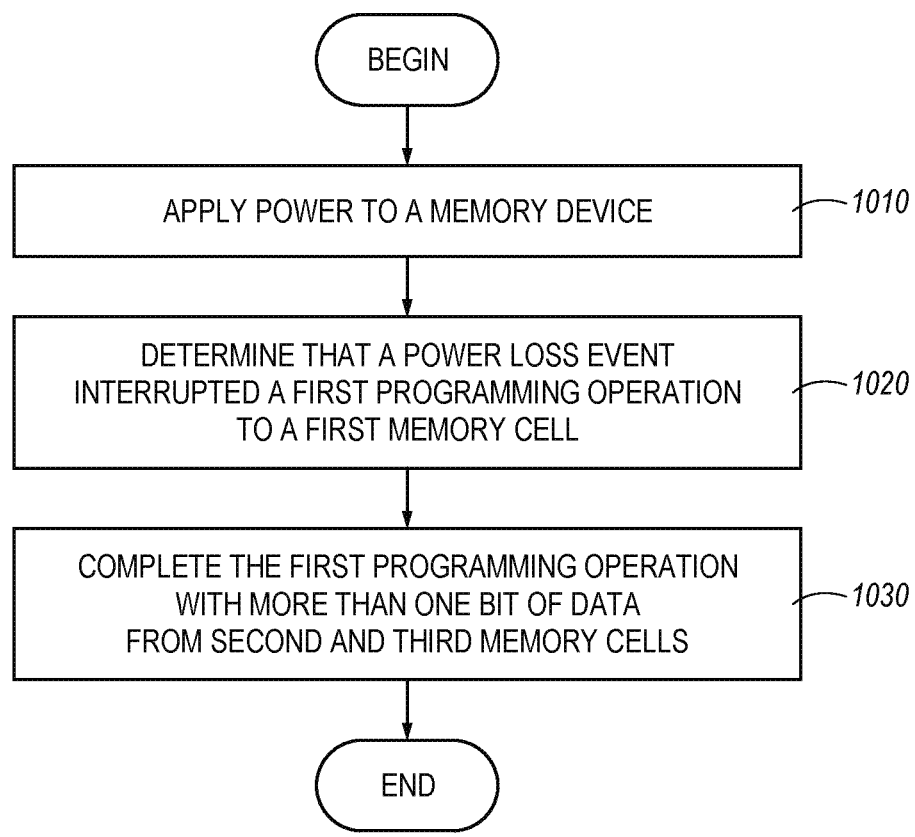
FIG. 10 is a flow chart illustrating a method of operating a memory device in accordance with an embodiment of the present technology.

FIG. 10 is a flow chart illustrating a method of operating a memory device in accordance with an embodiment of the present technology. The method begins in step 1010, in which power is applied to the memory device. In step 1020, the memory device determines that a power loss event interrupted a first programming operation configured to program a first memory cell of the memory device with more than one bit of information. In step 1030, the first programming operation is completed with more than one bit of information from second and third memory cells.

From the foregoing, it will be appreciated that specific embodiments of the invention have been described herein for purposes of illustration, but that various modifications may be made without deviating from the scope of the invention. Accordingly, the invention is not limited except as by the appended claims.

We claim:

1. A memory device, comprising:
a non-volatile memory comprising a plurality of memory cells; and
a controller configured to:
operate in either a first mode prioritizing storage utilization or in a second mode prioritizing energy efficiency and/or speed,
receive, from a connected host device, a first command to operate in the first mode,
begin, while operating in the first mode, a first programming operation configured to program a first one of the plurality of memory cells with more than one bit of information,
receive, from the connected host device, a second command to switch from the first mode to the second mode,
terminate the first programming operation in response to receiving the second command and without reference to a current or impending loss or reduction of power or energy,
program, with a second programming operation, second and third ones of the plurality of memory cells with the more than one bit of information, and
continue to operate in the second mode subsequent to the second programming operation.

2. The memory device of claim 1, wherein:
the second programming operation requires less energy to program the second and third ones of the plurality of memory cells in less time than the first programming operation would have taken to complete.

3. The memory device of claim 1, wherein:
the second programming operation is configured to program the second and third ones of the plurality of memory cells in less time than the first programming operation would have taken to complete.

4. The memory device of claim 1, wherein:
the first programming operation is configured to program the first one of the plurality of memory cells with a first plurality of programming pulses, and
the second programming operation is configured to program each of the second and third ones of the plurality of memory cells with fewer programming pulses than the first plurality of programming pulses.

5. The memory device of claim 1, wherein:
the second programming operation is configured to program each of the second and third ones of the plurality of memory cells with one bit of information of the more than one bit of information.

6. The memory device of claim 1, wherein:
the first one of the plurality of memory cells is configured as a triple level cell which has already been programmed with lower page data prior to the first programming operation, and
the first programming operation is configured to program the more than one bit of information by programming upper page data and extra page data to the first one of the plurality of memory cells.

7. The memory device of claim 6, wherein:
the second programming operation is configured to program the lower page data to the second one of the plurality of memory cells and to program the upper page data to the third one of the plurality of memory cells.

8. The memory device of claim 7, wherein:
the second programming operation is further configured to program the extra page data to a fourth one of the plurality of memory cells.

9. The memory device of claim 7, wherein:
each of the second and third ones of the plurality of memory cells is configured as a single level cell.

10. The memory device of claim 1, wherein the first one of the plurality of memory cells is located in a first memory block, and wherein the second and third ones of the plurality of memory cells are located in a second memory block.

11. A memory device, comprising:
a non-volatile memory comprising a plurality of memory cells; and
a controller configured to:
  operate in either a first mode prioritizing storage utilization or in a second mode prioritizing energy efficiency and/or speed,
  receive, from a connected host device, a first command to operate in the first mode,
  begin, while operating in the first mode, a first programming operation configured to program one bit of information to a first one of the plurality of memory cells, wherein the first one of the plurality of memory cells has been previously programmed with one or more additional bits of information,
  receive, from the connected host device, a second command to switch from the first mode to the second mode,
  terminate the first programming operation in response to receiving the second command and without reference to a current or impending loss or reduction of power or energy,
  program, with a second programming operation, a second one of the plurality of memory cells with the one bit of information, and
  continue to operate in the second mode subsequent to the second programming operation.

12. The memory device of claim 11, wherein:
the first one of the plurality of memory cells is configured as a triple level cell which has already been programmed with the one or more additional bits of information as lower page data and upper page data prior to the first programming operation, and
the first programming operation is configured to program the one bit of information by programming extra page data to the first one of the plurality of memory cells.

13. The memory device of claim 12, wherein:
the second programming operation is configured to program the extra page data to the second one of the plurality of memory cells.

14. The memory device of claim 13, wherein:
the second programming operation is further configured to program the lower page data to a third one of the plurality of memory cells.

15. The memory device of claim 14, wherein:
the second programming operation is further configured to program the upper page data to a fourth one of the plurality of memory cells.

16. The memory device of claim 15, wherein:
each of the second, third and fourth ones of the plurality of memory cells is configured as a single level cell.

17. A method of operating a memory device having a plurality of memory cells, the method comprising:
receiving, from a connected host device, a first command to operate in a first mode prioritizing storage utilization,
initiating, while operating in the first mode, a first programming operation configured to program a first one of the plurality of memory cells with more than one bit of information,
receiving, from the connected host device, a second command to switch from the first mode to a second mode,
terminating the first programming operation in response to receiving the second command and without reference to a current or impending loss or reduction of power or energy,
programming, with a second programming operation, second and third ones of the plurality of memory cells with the more than one bit of information, and
continuing to operate in the second mode subsequent to the second programming operation.

18. The method of claim 17, further comprising:
programming, with the second programming operation, a fourth one of the plurality of memory cells with at least one bit of information of the more than one bit of information.

* * * * *